United States Patent
Sun

(10) Patent No.: US 10,285,289 B2
(45) Date of Patent: May 7, 2019

(54) DISPLAY DEVICE

(71) Applicant: BOE TECHNOLOGY GROUP CO., LTD., Beijing (CN)

(72) Inventor: Li Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 12 days.

(21) Appl. No.: 15/321,485

(22) PCT Filed: Mar. 28, 2016

(86) PCT No.: PCT/CN2016/077504
§ 371 (c)(1),
(2) Date: Dec. 22, 2016

(87) PCT Pub. No.: WO2017/041481
PCT Pub. Date: Mar. 16, 2017

(65) Prior Publication Data
US 2017/0265317 A1 Sep. 14, 2017

(30) Foreign Application Priority Data

Sep. 10, 2015 (CN) .......................... 2015 1 0574249

(51) Int. Cl.
G09F 9/30 (2006.01)
H05K 5/02 (2006.01)
(Continued)

(52) U.S. Cl.
CPC ........... *H05K 5/0217* (2013.01); *G09F 9/301* (2013.01); *G09F 9/33* (2013.01); *G09F 9/35* (2013.01); *H05K 5/0017* (2013.01)

(58) Field of Classification Search
CPC .. G09F 9/301; G09F 2013/0481; G09F 9/302; G02F 2001/133314
See application file for complete search history.

(56) References Cited

U.S. PATENT DOCUMENTS 9,123,290 B1 * 9/2015 Cho ...................... G06F 1/1652
9,395,758 B2 7/2016 Zhang et al.
(Continued)

FOREIGN PATENT DOCUMENTS

| CN | 1347233 A | 5/2002 |
|----|-----------|--------|
| CN | 103514812 A | 1/2014 |

(Continued)

OTHER PUBLICATIONS

Nippon Seiki Co, Light Emitting Display Device; Nov. 11, 2010 (JP2010-256769).*

(Continued)

*Primary Examiner* — Steven T Sawyer
(74) *Attorney, Agent, or Firm* — Nath, Goldberg & Meyer; Joshua B. Goldberg

(57) ABSTRACT

The present invention belongs to the field of display technology, and particularly relates to a display device. The display device includes a display screen and a back plate mechanism provided on the non-display side of the display screen. The back plate mechanism includes a plurality of flat support plates. Any two adjacent flat support plates are connected with an included angle formed therebetween. The display screen forms a curved surface structure while being supported by the flat support plates. The display device is a curved surface display device having good curvature uniformity.

6 Claims, 5 Drawing Sheets

(51) Int. Cl.
*H05K 5/00* (2006.01)
*G09F 9/33* (2006.01)
*G09F 9/35* (2006.01)

(56) References Cited

U.S. PATENT DOCUMENTS

| | | | |
|---|---|---|---|
| 9,576,510 B2 | 2/2017 | Ren et al. | |
| 2014/0003006 A1* | 1/2014 | Ahn | G06F 1/1652 361/749 |
| 2014/0355195 A1 | 12/2014 | Kee et al. | |
| 2015/0043136 A1* | 2/2015 | Kim | G02F 1/133305 361/679.01 |
| 2015/0092361 A1* | 4/2015 | Cho | H02K 7/00 361/749 |
| 2016/0088743 A1* | 3/2016 | Zhang | G06F 1/1601 361/679.01 |
| 2016/0300513 A1* | 10/2016 | Ren | G09F 9/301 |

FOREIGN PATENT DOCUMENTS

| | | |
|---|---|---|
| CN | 104050882 A | 9/2014 |
| CN | 104217650 A | 12/2014 |
| CN | 104266146 A | 1/2015 |
| CN | 105044957 A | 11/2015 |

OTHER PUBLICATIONS

English translation of the written opinion of the international searching authority for international application No. PCT/CN2016/077504.

International search report dated Jun. 24, 2016 for international application No. PCT/CN2016/077504.

First Office Action dated Aug. 4, 2017 in corresponding Chinese Patent Application No. 201510574249.8.

* cited by examiner

DISPLAY DEVICE

This is a National Phase Application filed under 35 U.S.C. 371 as a national stage of PCT/CN2016/077504 filed Mar. 28, 2016, an application claiming the benefit of Chinese application No. 201510574249.8 filed on Sep. 10, 2015, the content of each of which is hereby incorporated by reference in its entirety.

TECHNICAL FIELD

The present invention relates to the field of display technology, and particularly relates to a display device.

BACKGROUND

Current mainstream display devices are flat panel display devices. With the progress of science and technology, curved surface display devices gradually rise. The curved surface display devices enable a viewer to experience the viewing effect in a cinema, and thus become a popular trend in the field of display.

In the process of manufacturing an existing curved surface display device, particularly, in the process of manufacturing a large-size curved surface display device, as shown in FIGS. 1 and 2, the most commonly used method is as follows: an external force is directly applied to left and right ends of a flat display screen, for example, a display screen 1 is placed in a curved support back plate 10 (also referred to as module frame), and resilience of the display screen 1 is counteracted by an external force from the support back plate 10, so that the display screen 1 keeps curved. The support back plate 10 generally needs to experience a bending treatment in advance, so that it can not only bear the weight of the display screen 1, but also counteract the resilience generated by the display screen 1 due to its bending after the display screen 1 and the support back plate 10 are assembled, so as to finally allow the entire display module to maintain a stable bending radius. Generally, the support back plate 10 has an arc shape, and is pre-bent to have a relatively small radius. However, various factors such as the specific shape of the arc, the radius formed by the pre-bending, the thickness of the plate, the density uniformity of material, and the like may have a large effect on the resilience generated by the support back plate 10, resulting in poor resilience uniformity of the finally-formed arcuate support back plate 10. The final values of the radii of curvature of the display screen 1 in the display module assembled in this way are distributed in a large range around a target value of the radius of curvature. If the final values of the radii of curvature deviate a lot from the target value of the radius of curvature, bending uniformity of the curved surface display screen is poor, thus affecting product quality of the display device.

Furthermore, because density uniformity of the material for forming the support back plate 10 is relatively fixed, for a same display screen 1, support back plates having different curvatures are needed to achieve different curvatures of the display screen 1, and thus many modes of support back plates are formed, which is not conducive to reducing manufacturing costs and improving product management. Moreover, the existing curved surface display device has a fixed bending radius, and therefore the best viewing distance is fixed, which leads to limited applications.

It can be seen that it has become an urgent technical problem to be solved to design a curved surface display device which can be easily manufactured, has good resilience uniformity and even has a display screen having variable curvature.

SUMMARY

In view of the above disadvantages existing in the prior art, the present invention provides a display device, in which a back plate mechanism for keeping a display screen in bending state is easily manufactured, has good resilience uniformity and can allow the display screen to have various curvatures, and thus can be assembled into a curved surface display device with good curvature uniformity.

According to an aspect of the present invention, there is provided a display device, comprising: a display screen, which has a display side for display and a non-display side opposite to the display side; and a back plate mechanism provided on the non-display side of the display screen, wherein, the back plate mechanism comprises a plurality of flat support plates, any two adjacent flat support plates are connected with an included angle formed therebetween, and the non-display side of the display screen is arranged to be tangent to each of the flat support plates, so that the display screen forms a curved surface structure while being supported by the flat support plates.

Optionally, the back plate mechanism further comprises an actuation portion, which is used for driving two adjacent flat support plates to rotate relatively to each other by taking edges of the two adjacent flat support plates contacting each other as a rotation axis, so as to change the included angle between the two adjacent flat support plates.

Optionally, the actuation portion comprises at least an actuation element having a variable length or a rotatable angle, to allow the included angle between two adjacent flat support plates to be adjustable, and more than one actuation portions are provided between two adjacent flat support plates.

Optionally, the actuation portion further comprises a first connection end and a second connection end, the first connection end and the second connection end are fixedly connected to two adjacent flat support plates, respectively, the actuation element is actively connected to the first connection end and the second connection end, respectively, a length of the actuation element is variable, and as the length of the actuation element changes, the actuation element is capable of driving the first connection end and the second connection end to move close to or away from each other, so as to change the included angle between the two adjacent flat support plates respectively connected to the first connection end and the second connection end.

Optionally, the actuation element comprises a hydraulic cylinder, a pneumatic cylinder, a screw pushing cylinder, or an electromagnetic actuator.

Optionally, an auxiliary adhesive block is provided in a gap area between the display screen and an included angle part formed by any two adjacent flat support plates, and is adhered to the display screen by an adhesive layer.

Optionally, every two adjacent flat support plates in the back plate mechanism forms an included angle part having a fixed angle, and an overall structure formed by all of the flat support plates causes the display screen assembled therewith to form a set curved surface structure.

Optionally, the included angle part formed by two adjacent flat support plates is provided with a reinforcement portion on a side thereof away from the display screen, and the reinforcement portion is of an integral structure or a split structure.

Optionally, the reinforcement portion comprises a longitudinal stiffener provided on the side of the included angle part away from the display screen and parallel to an extending direction of the included angle part, and the longitudinal stiffener is of a through integral structure arranged in the extending direction of the included angle part, or a split structure provided in segments and having a total length less than a length of the flat support plate.

Optionally, the reinforcement portion comprises a plurality of transverse stiffeners provided on the side of the included angle part away from the display screen and perpendicular to an extending direction of the included angle part, and the plurality of transverse stiffeners are parallel to each other.

Optionally, the flat support plates and the reinforcement portion are made of a same material, and are formed integrally or are formed into one whole by means of bonding or welding.

Optionally, material of the flat support plate comprises carbon fiber, aluminum alloy, stainless steel, glass, ceramic or organic glass.

Optionally, the back plate mechanism comprises at least three flat support plates, which have an identical width, or different widths.

Optionally, the display screen is a flexible display screen, and comprises an OLED panel or a liquid crystal panel.

The present invention has the beneficial effects as follows.

In the display device according to an aspect of the present invention, a back plate mechanism is formed by connecting a plurality of flat support plates, and an angle is formed between any two adjacent flat support plates. Therefore, as compared with the manner in which a back plate mechanism is formed by bending one flat support plate into a certain arc in the prior art, the back plate mechanism in the present invention can be manufactured more easily and has better resilience uniformity. Thus, the display device including the above back plate mechanism in the present invention has a curved display surface with good curvature uniformity.

In the display device according to another aspect of the present invention, an actuation portion is further provided at the junction of two adjacent flat support plates, and is fixed to the two adjacent flat support plates, respectively. The action of the actuation portion makes it possible to adjust the angle between two adjacent flat support plates, a bending radius of a back plate mechanism can thus be changed according to a desired radius of an inscribed arc. That is, curvature of a display screen supported by the back plate mechanism can be adjusted flexibly as needed, and the display device in which a display screen may have various curvatures is thus formed, thereby improving performance of the curved surface display device. Further, the angle between any two adjacent flat support plates can be adjusted, so that the curved surface display device having a complex arc can be formed.

In the display device according to still another aspect of the present invention, a back plate mechanism is formed by connecting a plurality of flat support plates, and stiffeners are provided between two adjacent flat support plates to fix an included angle between the two adjacent flat support plates. Therefore, the deformation amount of the display screen is easily formed to be uniform, and the curved surface display device having a bending radius distributed in a small range and good uniformity of curvature radius is obtained.

REFERENCE NUMERALS

1—display screen; 10—support back plate;
2—back plate mechanism; 21—flat support plate; 22—auxiliary adhesive block; 23—adhesive layer; 24—shaft; 25—actuation element; 26—first connection end; 27—second connection end; 28—stiffener.

DETAILED DESCRIPTION

To enable those skilled in the art to better understand the technical solutions of the present invention, a display device in the present invention will be further described in detail below in conjunction with the accompanying drawings and the specific implementations.

First Embodiment

This embodiment provides a display device, in which a back plate mechanism can be manufactured easily, has good resilience uniformity, and is capable of further adjusting curvature of a curved surface display screen of the display device.

Figure 1:
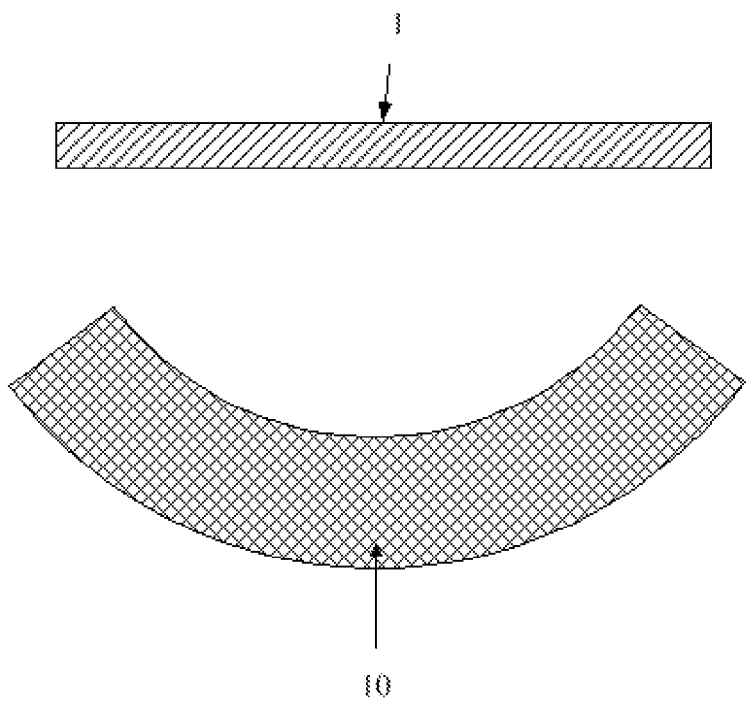
FIG. 1 is a schematic structure diagram of a display screen and a support back plate before they are assembled in the prior art.
Figure 2:
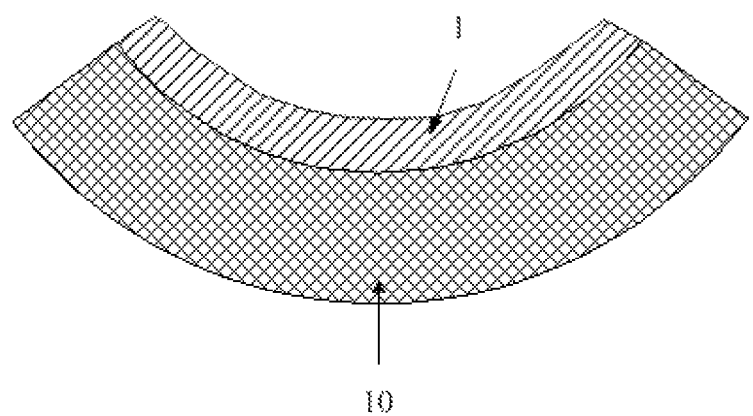
FIG. 2 is a schematic structure diagram of a display screen and a support back plate after they are assembled in the prior art.
Figure 3:
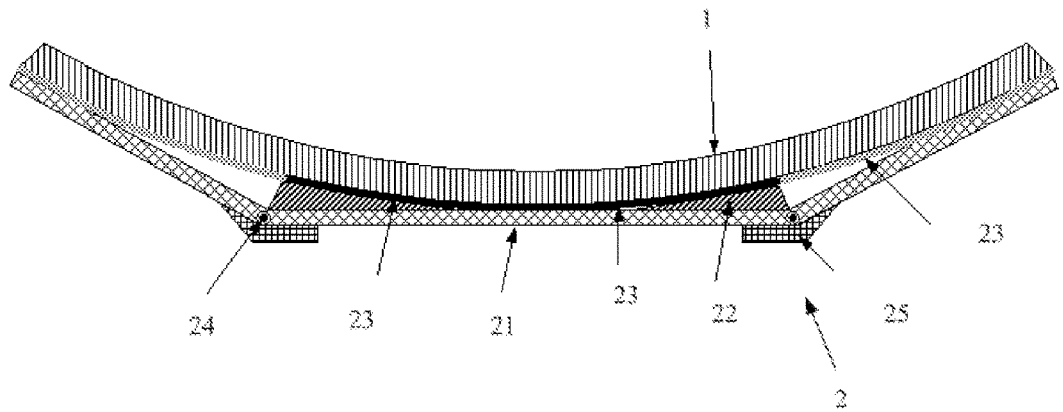
FIG. 3 is a top view of an exemplary structure of a display device in a first embodiment of the present invention.

As shown in FIG. 3, the display device includes a display screen 1 (having a display side for display and a non-display side opposite to the display side) and a back plate mechanism 2 provided at the non-display side of the display screen 1. The back plate mechanism 2 includes a plurality of flat support plates 21 provided sequentially, any two adjacent flat support plates 21 are connected such that an included angle is formed therebetween, and the non-display side of the display screen 1 is arranged to be tangent to each of the flat support plates 21, so that the display screen 1 forms a curved surface structure while being supported by the flat support plates 21. A different included angle between two adjacent flat support plates 21 corresponds to an inscribed circle having a different radius. Therefore, by changing the included angle between two adjacent flat support plates 21, curvature of a part of the display screen 1 supported by the two flat support plates 21 can be adjusted, thereby changing the curvature of the curved surface display device.

In the display device of the embodiment, the back plate mechanism 2 further includes an actuation portion, which is used for driving two adjacent flat support plates to rotate relatively to each other by taking edges of the two adjacent flat support plates contacting each other as a rotation axis, so as to change the included angle between the two adjacent flat support plates.

Figure 4:
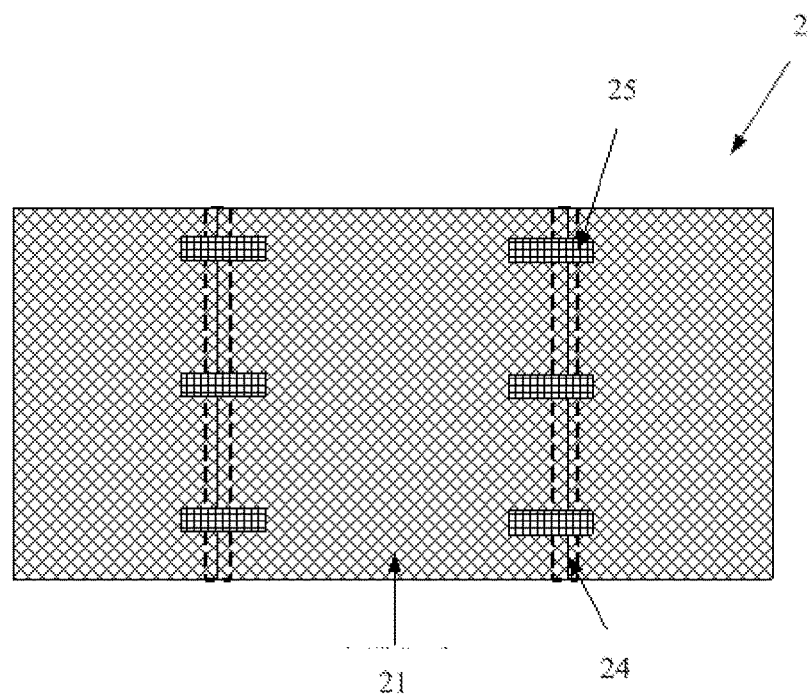
FIG. 4 is a rear view of an exemplary structure of a display device in the first embodiment of the present invention.

The actuation portion includes at least an actuation element whose length is variable or whose angle is rotatable. The actuation element allows the included angle between two adjacent flat support plates 21 to be adjustable. To ensure reliability and stability of angle adjustment, more than one actuation portions may be provided between two adjacent flat support plates 21. As shown in the rear view of the back plate mechanism 2 in FIG. 4, in the back plate mechanism 2, three actuation portions are provided between any two adjacent flat support plates 21.

Figure 5:
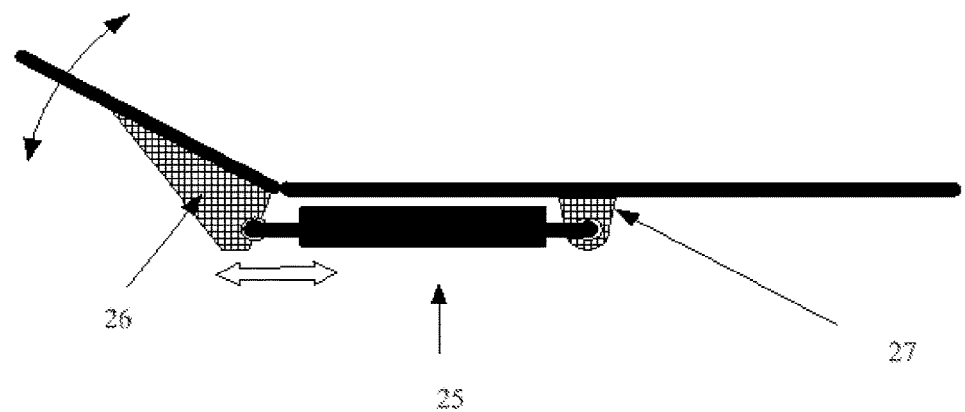
FIG. 5 is a schematic diagram of an exemplary structure of an actuation portion in the first embodiment of the present invention.

The above-described actuation portion may be a driving mechanism which has a variable length in a certain direction and includes a hydraulic cylinder, a pneumatic cylinder, a screw pushing cylinder, an electromagnetic actuator or the like. Specifically, as shown in FIG. 5, the actuation portion includes a first connection end 26, a second connection end 27 and an actuation cylinder (i.e., the actuation element 25). The first connection end 26 and the second connection end 27 are fixedly connected to two adjacent flat support plates 21, respectively. Two ends of the actuation cylinder are actively connected to the first connection end 26 and the second connection end 27, respectively. The length of the actuation cylinder is variable, and the first connection end 26 and the second connection end 27 can be driven to move close to or away from each other as the length of the actuation cylinder changes. According to desired radii of curvature of the display screen, the included angle between every two adjacent flat support plates 21 is adjusted through an action of the actuation portion, so that the display screen 1 is adjusted to be a curved surface display structure whose curved display surface has different radii of curvature, or a curved surface display structure having a complex curved surface (a plurality of arc surfaces are smoothly connected). In this way, transition of the display screen 1 from flat display to curved display is achieved, and the curvature of the display screen 1 can be changed as needed.

Optionally, the actuation cylinder is a hydraulic cylinder, which drives the first connection end 26 and the second connection end 27 to move close to or away from each other, so as to change the included angle between the two flat support plates 21 respectively connected to the first connection end 26 and the second connection end 27. As shown in FIG. 5, when the first connection end 26 and the second connection end 27 move close to or away from each other, two adjacent flat support plates 21 will rotate relatively to each other by taking edges of the two adjacent flat support plates 21 contacting each other as a rotation axis, thus changing the included angle between the two adjacent flat support plates 21.

Figure 6:
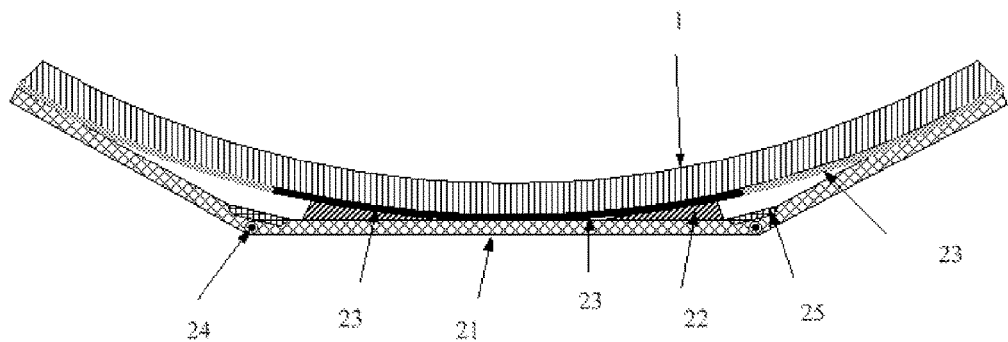
FIG. 6 is a top view of another exemplary structure of the display device in the first embodiment of the present invention.

In addition to the case where the actuation portion is provided at an outer side of the flat support plates 21 (i.e., a side of the flat support plates 21 away from the display screen 1), in order to guarantee the aesthetics of the whole structure, the actuation portion is preferably provided at an inner side of the flat support plates 21 (i.e., a side of the flat support plates 21 close to the display screen 1), and two adjacent flat support plates 21 are actively connected by a rotation axis 24, as shown in FIG. 6.

Figure 7:
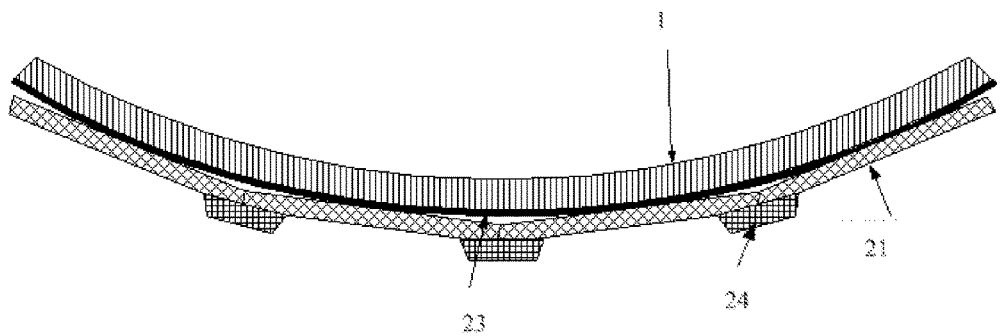
FIG. 7 is a top view of another exemplary structure of the display device in the first embodiment of the present invention.

The back plate mechanism 2 may include at least three flat support plates 21, each of which may have an identical width, or may have a different width. The back plate mechanism 2 shown in FIG. 7 includes four flat support plates 21, and three actuation portions are provided at the included angle part between any two adjacent flat support plates 21, to adjust the angle between the two adjacent flat support plates 21, thus forming a bending back plate mechanism having various bending radii, which allows the display screen assembled therewith to have a complex curved shape. It should be understood that, according to the number of the flat support plates 21, two adjacent flat support plates 21 may form an arbitrary angle therebetween, so as to form a curved display surface having various curvatures and shapes.

As shown in FIG. 3, the back plate mechanism 2 and the display screen 1 may be assembled by an adhesive layer 23, which may be divided into a plurality of segments spaced apart from each other. Optionally, parts of the adhesive layer 23 provided at end edges of the display screen 1 (i.e., left and right end edges of the display screen 1 in FIG. 3) may have relatively large elasticity, and thus have relatively large amount of deformation, which allows it to be easily deformed and better fit in with the curved back plate mechanism.

Further optionally, an auxiliary adhesive block 22 is provided in a gap area between the display screen 1 and the included angle part formed by any two adjacent flat support plates 21, and is adhered to the display screen 1 through the adhesive layer 23. The included angle part here refers to parts of two adjacent flat support plates 21 forming an angular shape when the two adjacent flat support plates 21 form a certain angle therebetween.

There is a wide selection of material for the flat support plate 21, as long as the material is not an easily deformed material, which is not limited herein. Optionally, the material of the flat support plate 21 includes carbon fiber, aluminum alloy, stainless steel, glass, ceramic or organic glass.

In the display device of the embodiment, the display screen 1 is a flexible display screen, and includes an OLED panel or a liquid crystal panel. Using the above-described back plate mechanism 2, a curved surface display device having an adjustable curvature and uniform resilience can be easily formed.

The present embodiment provides a curved surface display device having a variable curvature, in which a back plate mechanism is formed by connecting a plurality of flat support plates having an included angle therebetween. An actuation portion is further provided at the junction of two adjacent flat support plates, and is fixed to the two adjacent flat support plates, respectively. The action of the actuation portion makes it possible to adjust the angle between two adjacent flat support plates, a back plate mechanism with a variable bending radius can thus be formed according to a different radius of an inscribed arc, and further, curvature of a display screen supported by the back plate mechanism can be adjusted flexibly as needed. As a result, the display device having different curvatures can be obtained using a same display screen and a same back plate mechanism, which improves the product performance of the curved surface display device. Further, the angle between any two adjacent flat support plates can be adjusted, so that the curved surface display device having a complex curved shape can be formed.

Second Embodiment

This embodiment provides a display device, in which a back plate mechanism can be easily manufactured and has good resilience uniformity, and the display device has a curved display surface whose curvature uniformity is good. The present embodiment differs from the first embodiment in that curvature of the back plate mechanism 2 in the present embodiment is fixed and cannot be adjusted.

Figure 8:
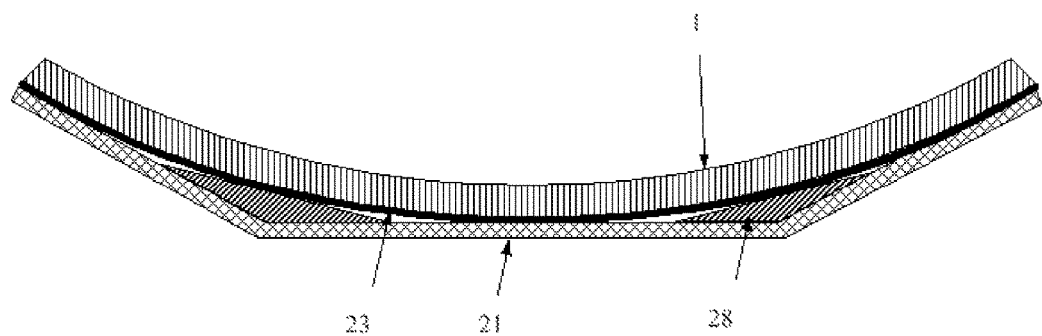
FIG. 8 is a top view of an exemplary structure of a display device in a second embodiment of the present invention.

In the back plate mechanism 2, any two adjacent flat support plates 21 form an included angle part having a fixed angle, and the overall structure formed by all of the flat support plates 21 causes the display screen 1 assembled therewith to form a set curved surface structure. As shown in FIG. 8, the overall structure formed by all of the flat support plates 21 is symmetrical with respect to a vertical center line (not shown in the figure) of the display screen 1, thus forming a centrosymmetric curved surface display device. Optionally, the included angle between two adjacent flat support plates ranges from 30 degrees to 270 degrees. In addition, the shape of the formed curved display surface is not limited to a centrosymmetric arc shape shown in FIG. 8, and may also be S-shaped, which is not limited here.

Optionally, the included angle part formed by two adjacent flat support plates 21 is provided with a reinforcement portion on a side thereof away from the display screen 1 (hereinafter referred to as the back of the included angle part), and the reinforcement portion may be of an integral structure or a split structure. The reinforcement portion may be used for correcting the resilience of the back plate mechanism 2, effectively improving the strength of the flat support plate 21 and avoiding deformation.

Figure 9:
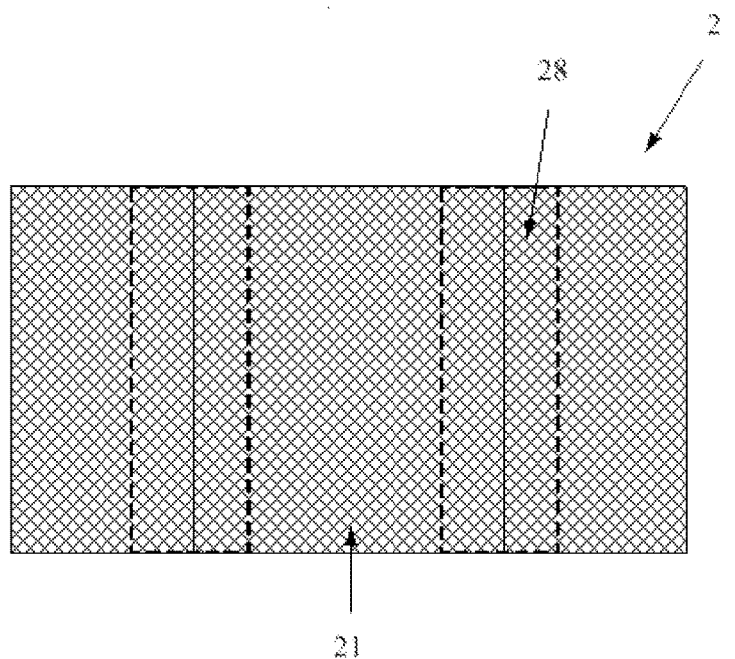
FIG. 9 is a schematic diagram of an exemplary structure of a reinforcement portion in the second embodiment of the present invention.
Figure 10:
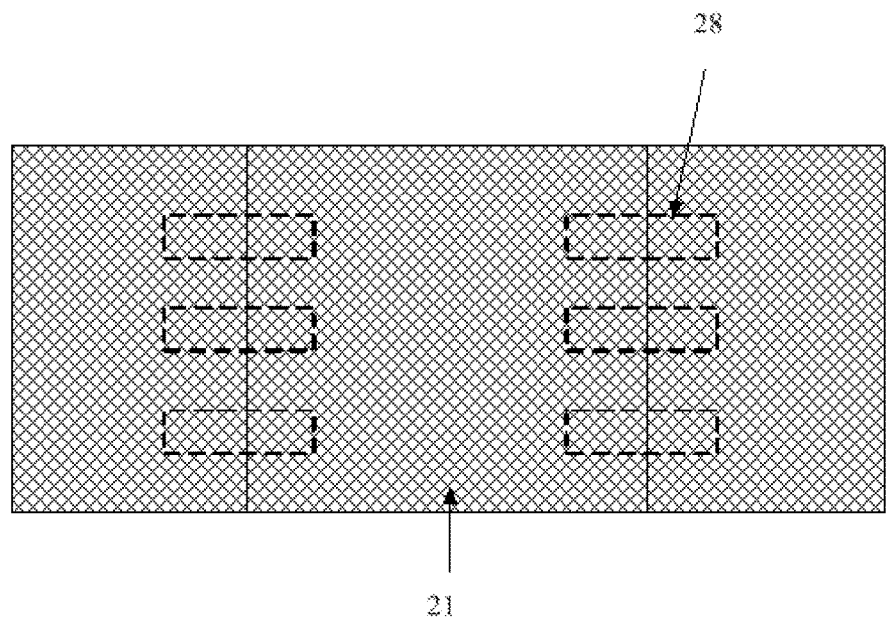
FIG. 10 is a schematic diagram of another exemplary structure of the reinforcement portion in the second embodiment of the present invention.

The reinforcement portion may be arranged in various manners. Depending on the relative relation between the reinforcement portion and an extending direction (i.e., an extending direction of the included angle part) of a bevel formed by two adjacent flat support plates 21 (i.e., edges of two adjacent flat support plates 21 contacting each other), the reinforcement portion may be arranged in a longitudinal or transverse direction. Specifically, the reinforcement portion includes a longitudinal stiffener provided on the back of the included angle part and parallel to the extending direction of the included angle part, and the longitudinal stiffener is of a through integral structure arranged in the extending direction of the included angle part. As shown in dashed box in FIG. 9, the stiffener 28 may be of an integral structure going through the entire length of the flat support plate 21 (FIG. 9 is a view when viewing in a direction from the display screen 1 to the back plate mechanism), or a split structure which is provided in segments and has a total length less than the length of the flat support plate 21. Alternatively, the reinforcement portion includes a transverse stiffener provided on the back of the included angle part and perpendicular to the extending direction of the included angle part, and there may be a plurality of transverse stiffeners parallel to each other. As shown in dashed box in FIG. 10, the stiffener 28 may be a plurality of strip-like components parallel to a width direction of the flat support plate 21 (FIG. 10 is a view when viewing in a direction from the display screen 1 to the back plate mechanism). Supporting force of the back plate mechanism can be adjusted by the stiffener 28. The stiffener can define the greatest degree of resilience of the display screen 1. Thus, even though the individual flat support plates differ in thickness, material uniformity, or the like, the maximum resilience of the display screen 1 can be defined by the stiffener, so that every part of the display screen 1 is unified to the maximum curvature defined by the stiffener. Hence, with the stiffener, resilience can be corrected, good uniformity of supporting force or resilience (deformation) for supporting the display screen is guaranteed, and thus curvature uniformity of the curved surface display product is good.

Figure 11:
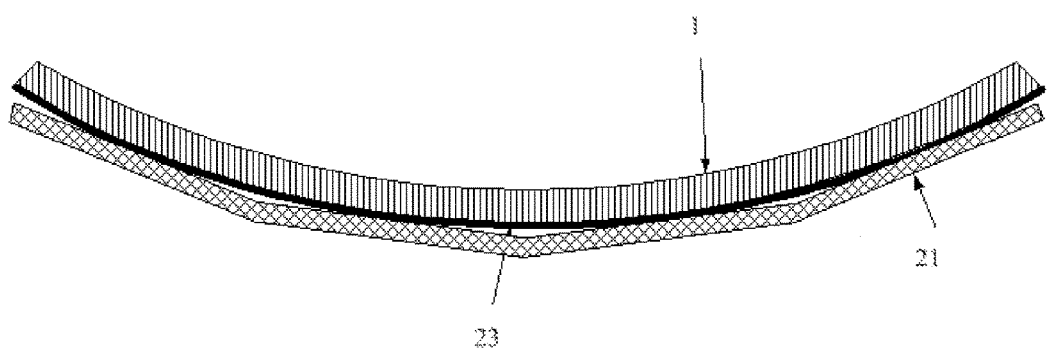
FIG. 11 is a top view of another exemplary structure of the display device in the second embodiment of the present invention.

The back plate mechanism 2 may include at least three flat support plates 21, each of which may have an identical width, or may have a different width. Needless to say, the above-described stiffener 28 is not necessarily required, and can be omitted by forming the flat support plates 21 using a material of large strength, so as to ensure light weight of the whole display device. The back plate mechanism 2 shown in FIG. 11 includes four flat support plates 21, and no stiffener 28 is provided, so that a curved back plate mechanism having a fixed bending radius is formed. It should be understood here that, according to the number of the flat support plates 21, the angle between two adjacent flat support plates 21 can be arbitrarily set, so as to form a curved display surface having various curvatures and shapes.

Like the first embodiment, in the display device of the present embodiment, the back plate mechanism 2 and the display screen 1 may also be assembled by an adhesive layer, and gentle change in the angle between two adjacent flat support plates 21 is ensured through deformation of the adhesive layer.

The flat support plates 21 and the reinforcement portion may be made of a same material. The flat support plates 21 and the reinforcement portion may be formed integrally or may be formed into one whole by means of bonding or welding. The specific forming method is not limited herein, and any convenient and easy forming method may be adopted. Needless to say, the plurality of flat support plates 21 for forming the back plate mechanism may be formed integrally, or may be formed through connection using a method such as bonding, welding or the like, which is not limited here.

There is a wide selection of material for the flat support plate 21, as long as the material is not an easily deformed material, which is not limited herein. Optionally, the material of the flat support plate 21 includes carbon fiber, aluminum alloy, stainless steel, glass, ceramic or organic glass.

Here, the display screen 1 is a flexible display screen, and includes an OLED panel or a liquid crystal panel. Using the above-described back plate mechanism 2, a curved surface display device having uniform resilience can be easily formed.

In the display device of the present embodiment, the back plate mechanism is formed by connecting a plurality of flat support plates, and the included angle between two adjacent flat support plates can be fixed by providing a stiffener between the two adjacent flat support plates, so that the display screen supported by the back plate mechanism has uniform amount of deformation finally. Hence, the curved surface display device having a bending radius distributed in a small range and good uniformity of curvature radius is obtained.

It can be understood that, the above implementations are merely exemplary implementations used for explaining the principle of the present invention, but the present invention is not limited thereto. For those skilled in the art, various modifications and improvements may be made without departing from the spirit and essence of the present inven-

The invention claimed is:

1. A display device, comprising:
   a display screen, which has a display side for display and a non-display side opposite to the display side; and
   a back plate mechanism provided on the non-display side of the display screen,
   wherein, the back plate mechanism comprises a plurality of flat support plates, any two adjacent flat support plates are connected such that an included angle is formed therebetween, and the non-display side of the display screen is arranged to be tangent to each of the flat support plates, so that the display screen forms a curved surface structure while being supported by the flat support plates, and
   every two adjacent flat support plates in the back plate mechanism forms an included angle part having a fixed angle, and an overall structure formed by all of the flat support plates causes the display screen assembled therewith to form a set curved surface structure,
   wherein the included angle part formed by two adjacent flat support plates is provided with a reinforcement portion on a side thereof away from the display screen, and the reinforcement portion is of an integral structure or a split structure; and
   the reinforcement portion comprises a longitudinal stiffener provided on the side of the included angle part away from the display screen and parallel to an extending direction of the included angle part, and the longitudinal stiffener is of a through integral structure arranged in the extending direction of the included angle part, or a split structure provided in segments and having a total length less than a length of the flat support plate.

2. The display device according to claim 1, wherein, the reinforcement portion comprises a plurality of transverse stiffeners provided on the side of the included angle part away from the display screen and perpendicular to an extending direction of the included angle part, and the plurality of transverse stiffeners are parallel to each other.

3. The display device according to claim 1, wherein, the flat support plates and the reinforcement portion are made of a same material, and are formed integrally or are formed into one whole by means of bonding or welding.

4. The display device according to claim 1, wherein, the back plate mechanism comprises at least three flat support plates, which have an identical width, or different widths.

5. The display device according to claim 3, wherein, the back plate mechanism comprises at least three flat support plates, which have an identical width, or different widths.

6. The display device according to claim 2, wherein, the back plate mechanism comprises at least three flat support plates, which have an identical width, or different widths.

* * * * *